(12) United States Patent
Yamazaki et al.

(10) Patent No.: US 7,492,338 B2
(45) Date of Patent: Feb. 17, 2009

(54) DISPLAY DEVICE

(75) Inventors: Shunpei Yamazaki, Tokyo (JP); Hajime Kimura, Kanagawa (JP); Shinji Maekawa, Kanagawa (JP); Osamu Nakamura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 796 days.

(21) Appl. No.: 10/974,022

(22) Filed: Oct. 27, 2004

(65) Prior Publication Data

US 2005/0122349 A1 Jun. 9, 2005

(30) Foreign Application Priority Data

Oct. 28, 2003 (JP) .............................. 2003-368075

(51) Int. Cl.
*G09G 3/32* (2006.01)

(52) U.S. Cl. .......................................... 345/83; 345/76

(58) Field of Classification Search ........... 345/87–100, 345/76–82, 83; 315/169.1, 169.3; 365/185.01, 365/185.03; 257/200, 213, 223, 314, 350; 438/471
See application file for complete search history.

(56) References Cited

U.S. PATENT DOCUMENTS 7,167,147 B2 * 1/2007 Tanaka et al. ................. 345/82

OTHER PUBLICATIONS

Naoki Nakanose A variable Channel Size Mosfet with LDD structure 2003.*

Naoki Nakanose et al., "A Variable Channel-Size MOSFET with LDD Structure," Extended Abstracts of the 2003 International Conference on Solid State Devices and Materials, Tokyo, 2003, pp. 424-425.

* cited by examiner

*Primary Examiner*—Nitin Patel
(74) *Attorney, Agent, or Firm*—Eric J. Robinson; Robinson Intellectual Property Law Office, P.C.

(57) ABSTRACT

In a conventional display device using light emitting elements, white color cannot be accurately displayed since the luminance of each sub-pixel varies for each color. Therefore, in order to achieve the uniformity in luminance of each sub-pixel, the amount of current or the current density flowing in light emitting elements is required to be changed for each color. In that case, a power source is necessarily provided for each color, thus an external circuit is increased, leading to increase in the cost and power consumption. According to the invention, a variable channel-size MOS transistor is used as a transistor for driving a light emitting element. When a signal voltage applied to a control gate is controlled for each sub-pixel, the amount of current or the current density flowing in light emitting elements can be adjusted and luminance of each sub-pixel can also be adjusted for each color.

17 Claims, 11 Drawing Sheets

N-type VS-MOS

FIG. 2B

P-type VS-MOS

DISPLAY DEVICE

BACKGROUND OF THE INVENTION

1. Field of the Invention

The present invention relates to a display device using light emitting elements and a manufacturing method thereof. More particularly, the invention relates to a multicolor display device and a manufacturing method thereof.

2. Description of the Related Art

In recent years, the development of a display device using light emitting elements has been advanced. A display device that is currently under development is the one in which one pixel is divided into three sub-pixels each corresponding to one of R (Red), G (Green) and B (Blue) that are the three primary colors of light, and a gray scale display is performed in each of the sub-pixels for RGB, and thereby performing a multicolor display. When performing the multicolor display, typically, light emitting elements are formed by using light emitting materials corresponding to RGB, or a light emitting element that emits white light is used in combination with RGB color filters. Alternatively, a light emitting element that emits any color light is used in combination with a color conversion material typified by a fluorescent material.

In LSI technologies, well known is a variable channel-size MOSFET including a main gate as well as a control gate that is provided between the main gate and a source region and between the main gate and a drain region (see Non Patent Document 1, for instance).

[Nonpatent Document 1] Naoki Nakanose and five others, SSDM2003, pp. 424-425

In the case of a multicolor display being performed by using sub-pixels, even when a current with the same current density or the same amount of current is supplied to a light emitting element in each sub-pixel, luminance varies for each light emitting element of RGB. Further, in the case of a light emitting element that emits white light being used in combination with color filters, or a light emitting element that emits any color light being used in combination with a color conversion material typified by a fluorescent material, the light transmittance of each color filter varies as well as the conversion efficiency of the color conversion material, and thus the obtained luminance has variations.

In the case of displaying white color in this state, luminance varies for each sub-pixel corresponding to each color, therefore, white may be tinged with red, blue or green, and white color cannot be displayed accurately.

Therefore, in order to achieve the uniformity in luminance of each sub-pixel, the amount of current or the current density flowing in a light emitting element is required to vary for each color.

SUMMARY OF THE INVENTION

In that case, it is necessary to provide a power source for each color, and thus an external circuit is increased, leading to increase in the cost and power consumption. In view of the foregoing problems, the invention provides a display device of which an external circuit is made smaller and the cost and power consumption are reduced.

In order to solve the aforementioned problems of the conventional technologies, the invention will take the following measures.

According to the invention, a variable channel-size MOS transistor (hereinafter referred to as VS-MOS) having a control gate for varying the channel size is used as a transistor for driving a light emitting element.

A VS-MOS comprises a control gate for varying the channel size, that is added to an existing MOS transistor. More specifically, one or more control gates are provided between a gate and a source or/and between a gate and a drain of an existing transistor. When a voltage applied to the control gate changes, it is possible to change a current value flowing between the source and the drain of the transistor without varying the gate voltage or the L/W size of the transistor.

Accordingly, when a signal voltage applied to a control gate of a VS-MOS is controlled for each sub-pixel, the amount of current or the current density flowing in a light emitting element can be controlled, and thereby luminance can be controlled for each sub-pixel.

It is noted that a light emitting element is formed of various materials such as an organic material, an inorganic material, a thin film material, a bulk material, and a dispersion material. In particular, an organic light emitting diode (OLED) formed mainly of an organic material is a typical light emitting element. A light emitting element includes an anode, a cathode, and an electroluminescent layer disposed between the anode and the cathode. The electroluminescent layer is formed of one or more materials selected from the aforementioned materials.

A pixel may include any display element such as an OLED element and an element used for FED.

According to the invention having the structure described above, a display device of which an external circuit is made smaller and the cost and power consumption are reduced can be provided as well as a manufacturing method thereof. In addition, the invention can provide a display device of which gray scale reproducibility and color reproducibility are improved as well as a manufacturing method thereof.

DETAILED DESCRIPTION OF THE INVENTION

Although the invention will be fully described by way of Embodiment Modes with reference to the accompanying drawings, it is to be understood that various changes and modifications will be apparent to those skilled in the art. Therefore, unless such changes and modifications depart from the scope of the invention, they should be constructed as being included therein. It is noted that in the structures of the invention described below, the same components are denoted by the same reference numerals in different drawings.

Embodiment Mode 1

Figure 2A:
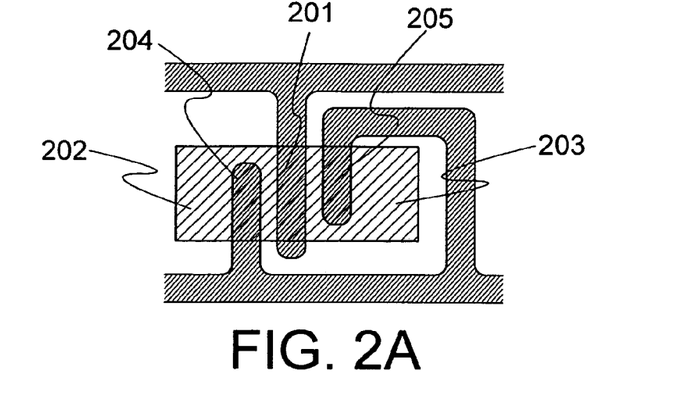
FIG. 2A is a schematic layout diagram of a VS-MOS used in the invention and FIGS. 2B and 2C are circuit symbols of the same.
Figure 2B:
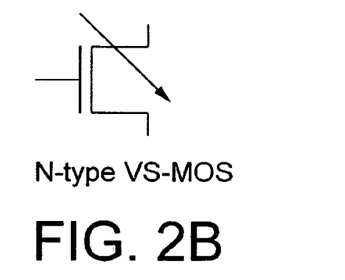
Figure 2C:
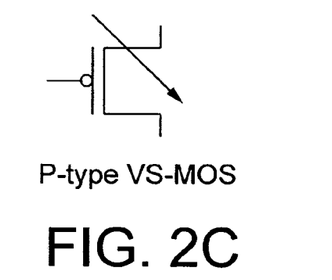

First, an example of a schematic layout of a VS-MOS and circuit symbols are shown in FIGS. 2A to 2C. As shown in the drawings, a VS-MOS comprises a control gate 204 between a main gate 201 and a source region 202, and a control gate 205 between the main gate 201 and a drain region 203. In the VS-MOS having such a structure, when varying a voltage applied to the control gates 204 and 205, it is possible to change a current value flowing between the source region 202 and the drain region 203 without varying a voltage applied to the main gate 201.

Figure 3:
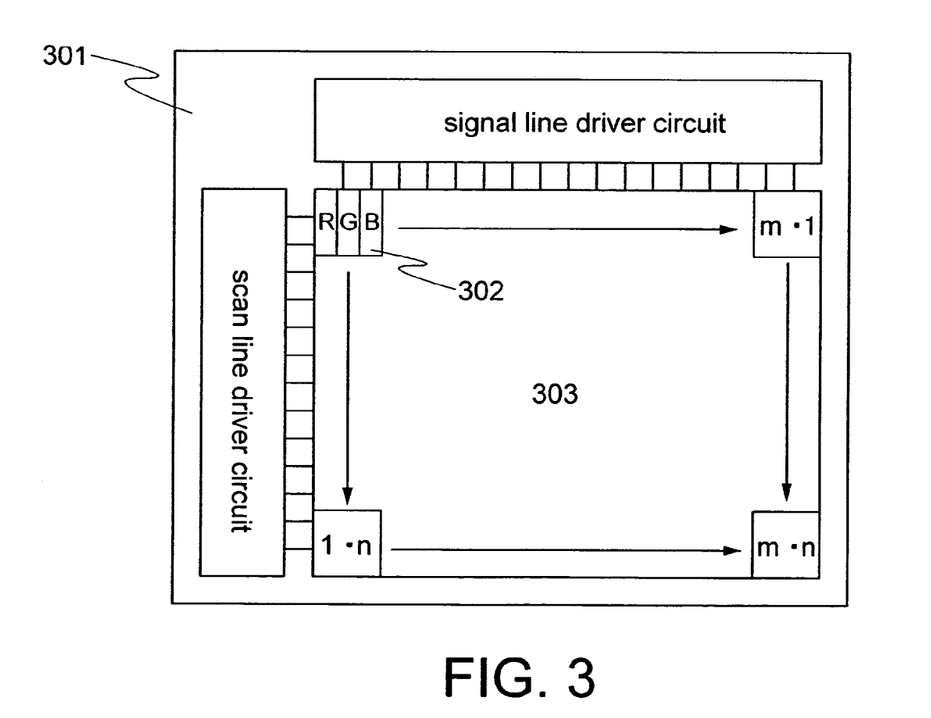
FIG. 3 is a diagram showing a display device according to the invention.

Next, shown in FIG. 3 is a structure of a display device in which the VS-MOS is used for a transistor for driving a light emitting element. A display device comprises over a substrate 301 a pixel portion 303 that includes m×n pixels 302 arranged in matrix. Each of the pixels 302 includes three sub-pixels each corresponding to one of RGB. It is noted that the sub-pixels correspond to the ones formed of light emitting elements using three color light emitting materials corresponding to RGB, the ones formed by combining a light emitting element that emits white light and RGB color filters, the ones formed by combining a light emitting element that emits any color light and a color conversion material typified by a fluorescent material, and the like.

FIG. 3 shows a horizontal stripe array in which sub-pixels of the same color are aligned in horizontal direction, however, the invention is not limited to this. For example, a delta array in which sub-pixels are displaced by half sub-pixel for each row, a mosaic array in which sub-pixels are displaced by one sub-pixel for each row, or a square array in which four sub-pixels form one pixel may be employed. Further, in FIG. 3, the pixel 302 includes three sub-pixels each of which emits light of one of RGB, however, the invention is not limited to this. The number of sub-pixels included in the pixel 302 and the color of light emitted from each sub-pixel can be set arbitrarily.

Figure 1A:
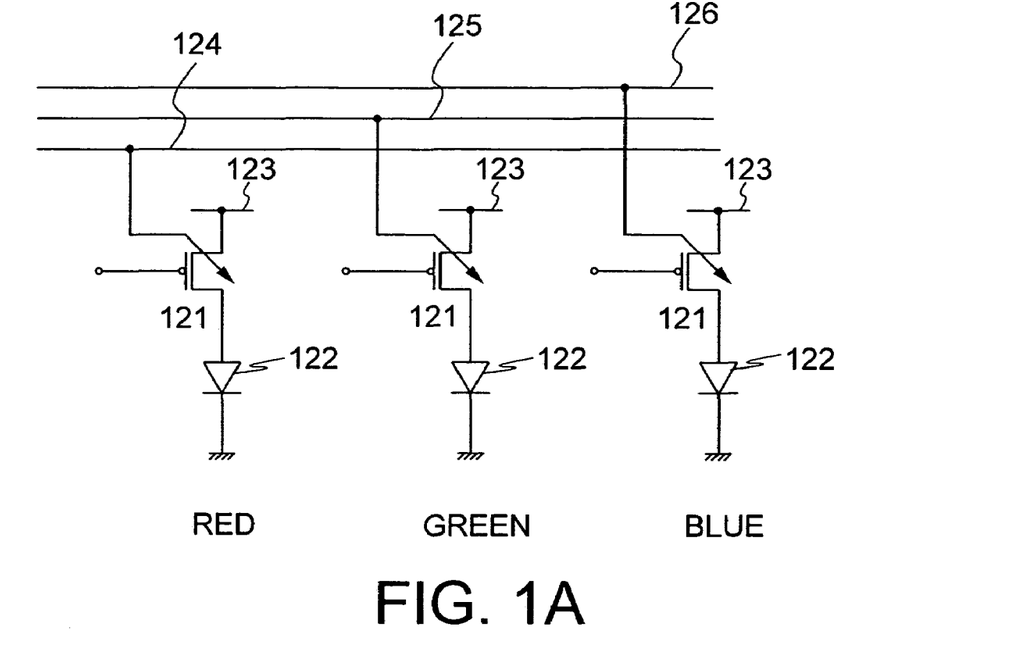
FIGS. 1A and 1B are circuit diagrams according to the invention.
Figure 1B:
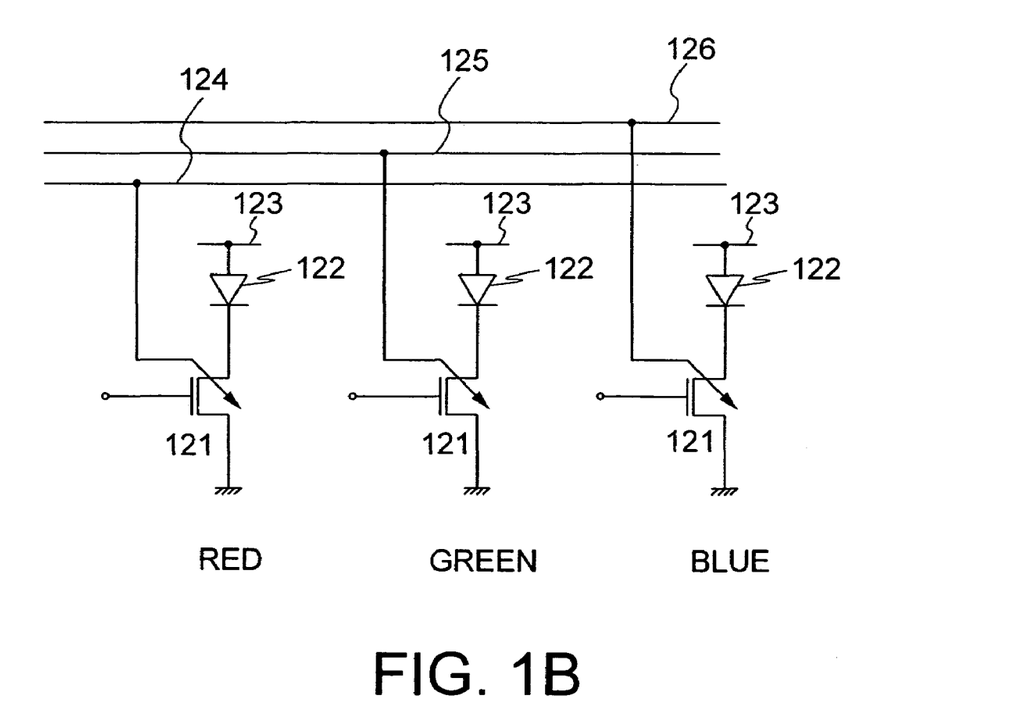

For the aforementioned sub-pixels, circuits shown in FIGS. 1A and 1B are employed. Further, each of the sub-pixels comprises a driving transistor 121, a light emitting element 122 connected to a drain of the driving transistor 121, a power source line 123 for the light emitting element connected to a source of the driving transistor 121, and control gate signal lines 124, 125, and 126 that is connected to a control gate of the driving transistor 121. For the driving transistor 121, a VS-MOS is employed.

When different signal voltages applied to the control gate are controlled for each sub-pixel by the control gate signal lines 124, 125, and 126, the amount of current or the current density flowing in the light emitting element 122 is adjusted and thus all the sub-pixels can have the same luminance. Accordingly, white color that is tinged with none of RGB can be displayed. That is, when a voltage applied to the control gate is arbitrarily controlled, white balance can be adjusted, leading to display with a desired color.

In addition, a VS-MOS used for the driving transistor 121 allows to meet the problems of degradation. Even in the case of a degradation level being varied for each light emitting element of each color, when a voltage of the control gate is arbitrarily controlled in accordance with display time, luminance decay and unbalanced white color due to degradation can be enhanced.

It is noted that in this invention, connection means electrical connection. Accordingly, in the structures disclosed in this specification, other elements that allow electrical connection (for example, another element, switch and the like) may be added to a predetermined connection.

Embodiment Mode 2

In the invention, a transistor obtained in manufacturing steps described below can be employed. Described hereinafter are manufacturing steps of a VS-MOS.

A droplet ejection method here means a method typified by an inkjet method and a dispenser method.

Figure 4A:
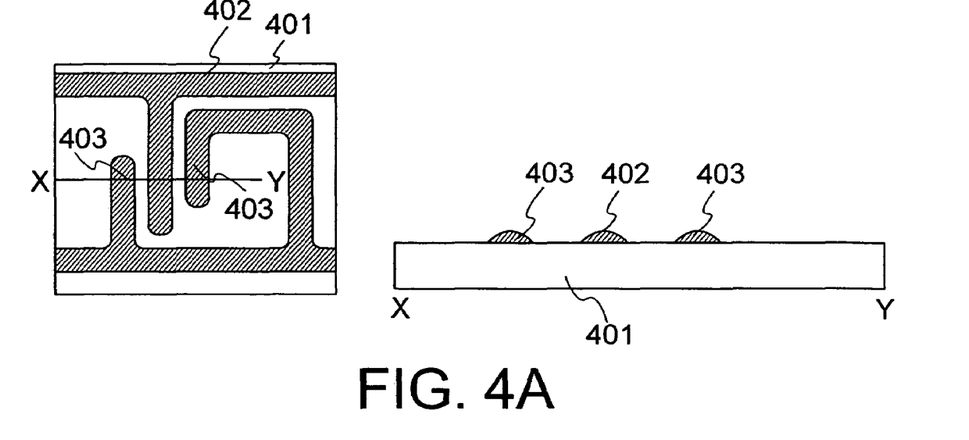
FIGS. 4A to 4C are diagrams explaining a manufacturing method of a channel etched thin film transistor.

A composition containing a conductive material is ejected onto a substrate 401 by the droplet ejection method to form a conductive layer 402 functioning as a gate electrode and conductive layers 403 functioning as control gates (see FIG. 4A).

Figure 4B:
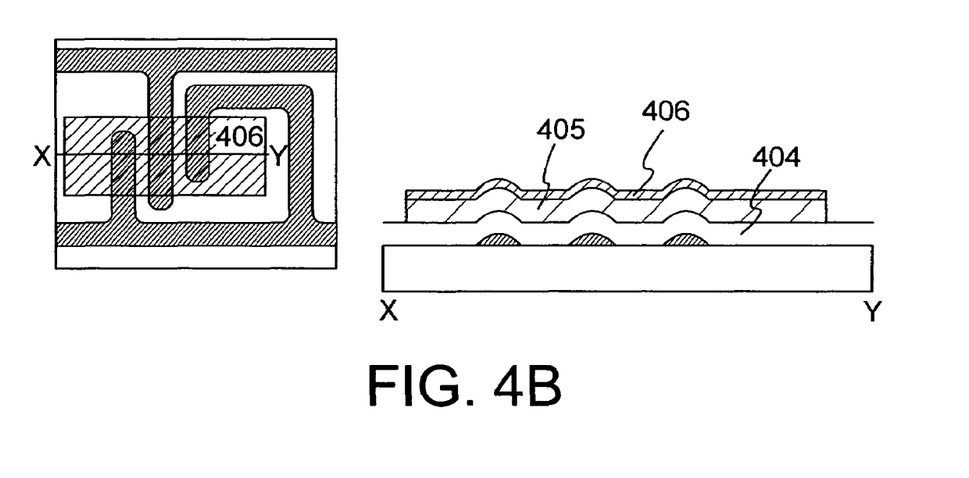

Then, an insulating layer 404 functioning as an insulating film is formed. The insulating layer 404 may be formed of a single layer or a plurality of stacked layers. Further, an I-type amorphous silicon layer 405 and an N-type amorphous silicon layer 406 are formed. Subsequently, the I-type amorphous silicon layer 405 and the N-type amorphous silicon layer 406 are patterned using a resist or the like used as a mask, then the resist or the like used as a mask is removed (see FIG. 4B).

Next, a composition containing a conductive material is ejected to form conductive layers 407 functioning as a source electrode, a drain electrode or the like. Further, the N-type amorphous silicon layer 406 is patterned using the conductive layers 407 as masks (see FIG. 4C).

Figure 4C:
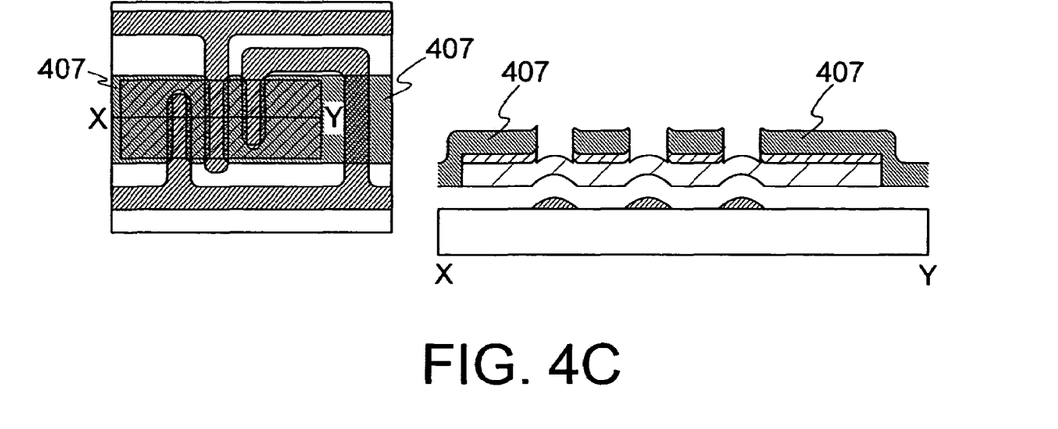

By the aforementioned steps, a channel etched semiconductor device using an N-type amorphous silicon can be obtained.

Figure 5A:
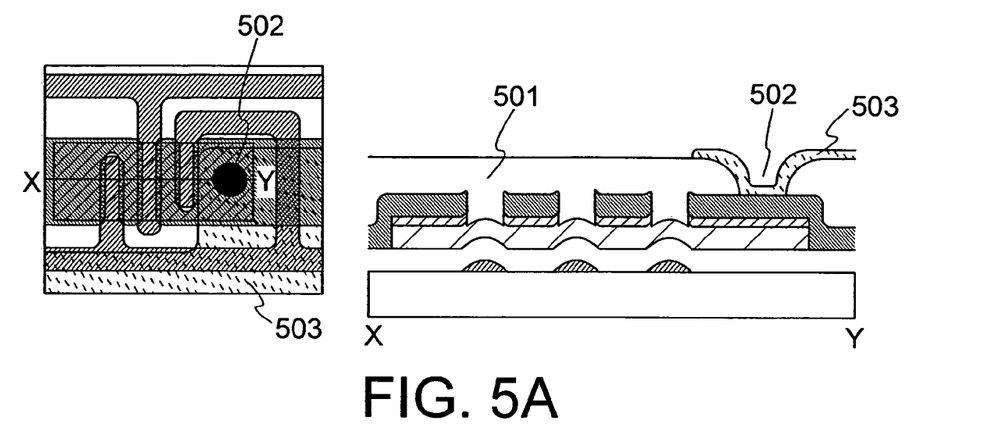
FIGS. 5A to 5C are diagrams explaining a manufacturing method of a channel etched thin film transistor.

Furthermore, an insulating layer 501 is formed. The insulating layer 501 may be formed of an inorganic insulating film such as an oxide film and a nitride film, or an organic insulating film such as an acrylic film and a siloxane film, or it may be formed of stacked layers of them. Then, an opening portion 502 is formed in the insulating layer 501, and a composition containing a conductive material is ejected to form a conductive layer 503 so as to be in contact with the conductive layer 407 (see FIG. 5A). It is preferable to use a light transmitting material for the conductive layer 503, and more specifically, ITO, IZO, ITSO formed of ITO and silicon oxide, and the like are desirably employed.

Figure 5B:
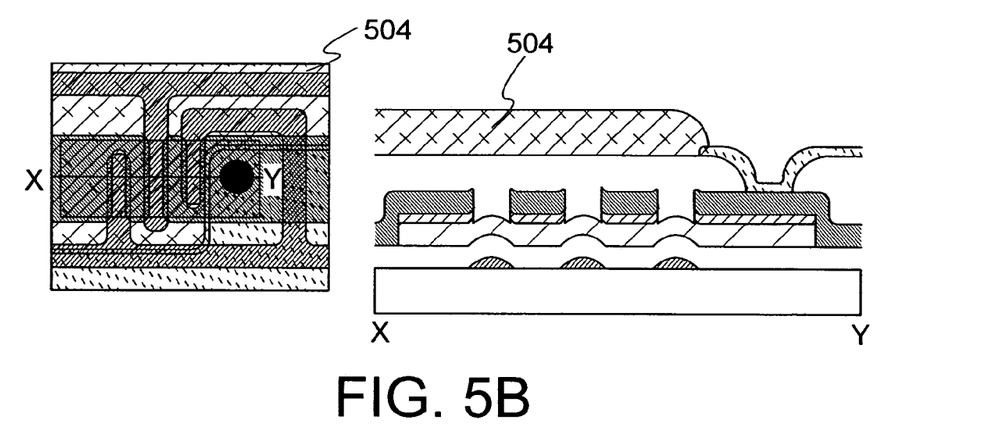
Figure 5C:
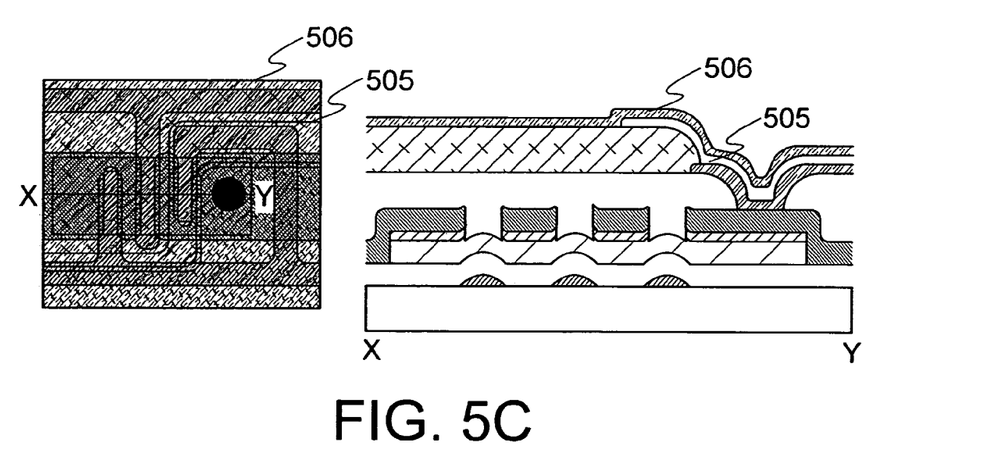

Subsequently, an insulating layer 504 functioning as a bank is formed (see FIG. 5B). Then, a light emitting layer 505 and a conductive layer 506 are formed in this order (see FIG. SC).

Although a manufacturing method of a semiconductor device using an N-type amorphous silicon is described in this embodiment mode, the invention can be applied to a semiconductor device using a P-type amorphous silicon.

Further, a transistor used for the invention is not exclusively limited. It may be a thin film transistor (TFT) using a non-single crystalline semiconductor film typified by amorphous silicon or polycrystalline silicon, a MOS transistor formed by using a semiconductor substrate or an SOI substrate, a junction transistor, a bipolar transistor, a transistor using an organic semiconductor or a carbon nanotube, or other transistors. Furthermore, a substrate on which a transistor is mounted is not exclusively limited to a certain type. It may be a single crystalline substrate, an SOI substrate, a glass substrate, or the like.

Embodiment Mode 3

Figure 6A:
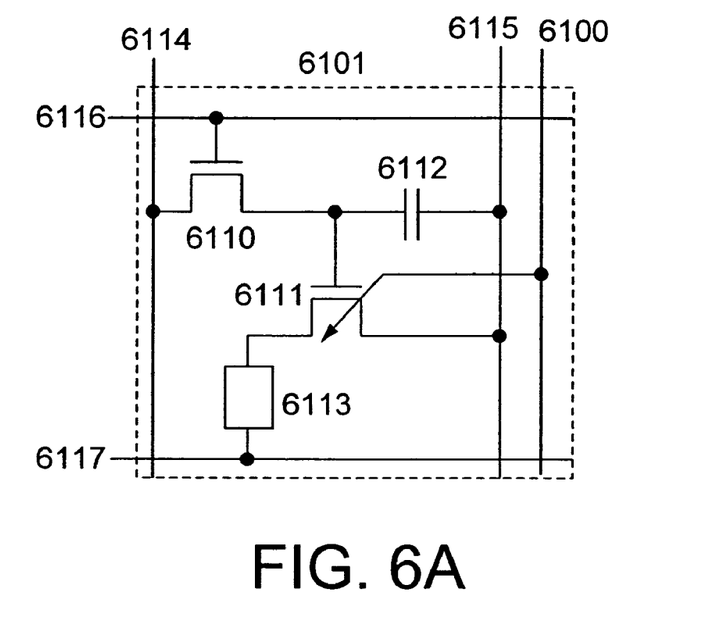
FIGS. 6A and 6B are circuit diagrams of a pixel using the invention.

A pixel circuit using the invention is described with reference to FIGS. 6A and 6B. FIG. 6A shows an area surrounded by a signal line 6114, power source lines 6115 and 6117, and a scan line 6116, which includes a transistor 6110 for controlling a video signal input to a pixel 6101, a transistor 6111 for controlling a current value flowing into a light emitting element 6113, a control gate signal line 6100 for supplying a signal to a control gate of the transistor 6111, and a capacitor 6112 for holding a gate-source voltage of the transistor 6111. It is noted that a gate capacitance or other parasitic capacitance of the transistor 6111 may be used instead of the capacitor 6112.

Figure 6B:
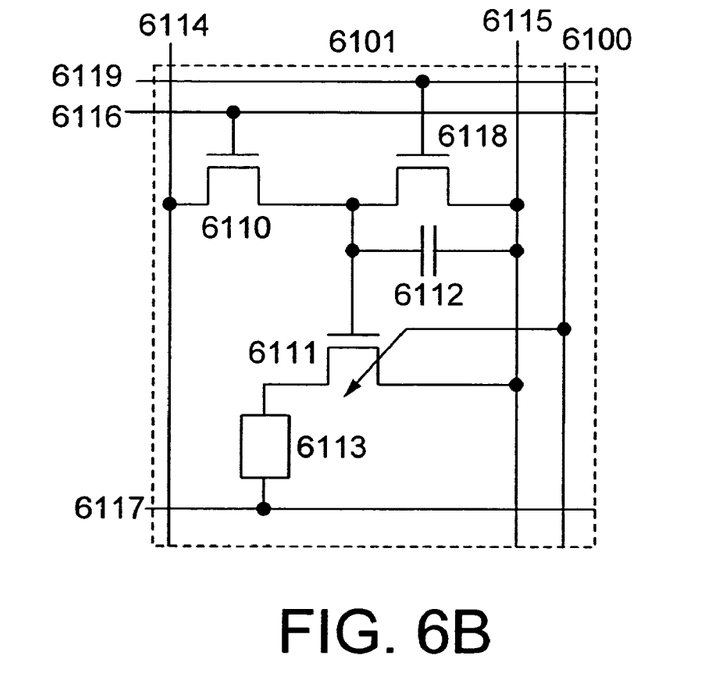

FIG. 6B shows a pixel circuit in which a transistor 6118 and a scan line 6119 are additionally provided in the pixel 6101 shown in FIG. 6A. The transistor 6118 makes a state in which a current supply to the light emitting element 6113 is forcibly stopped. Therefore, a lighting time can be started simultaneously with or immediately after a writing period without waiting the completion of signal writing to all the pixels. As a result, the duty ratio is increased, leading to the improvement of dynamic display in particular.

It is noted that either an analog video signal or a digital video signal may be employed for a display device using the invention. Particularly, in the case of an analog video signal being used, a digital video signal being used to perform a constant current drive, and the like, a VS-MOS is desirably used as the transistor 6111 because a current value flowing into the light emitting element 6113 can be controlled by the transistor 6111.

Figure 7A:
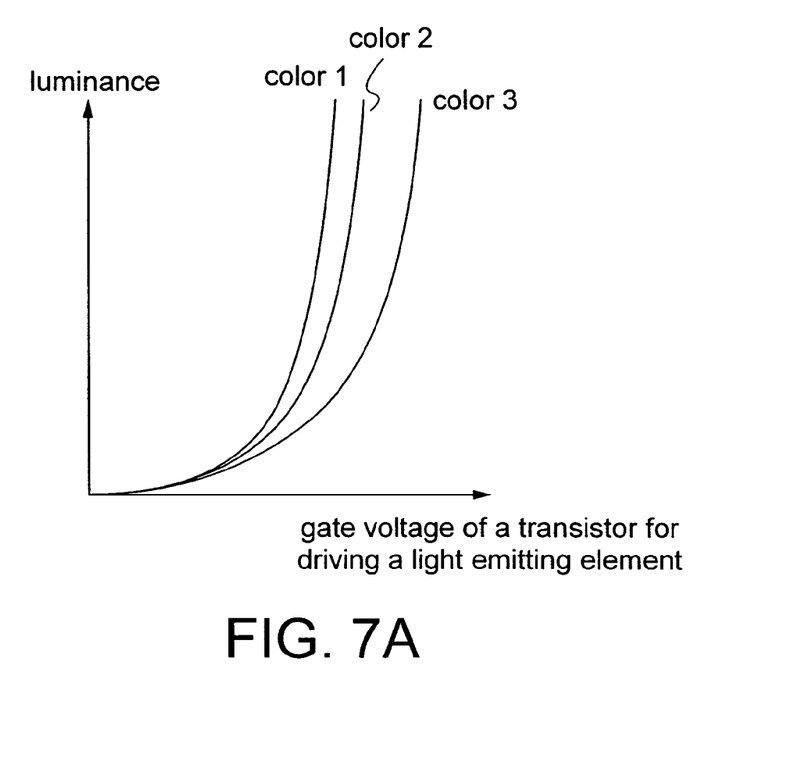
FIGS. 7A and 7B are graphs showing characteristics of luminance and gate voltage of a transistor for driving a light emitting element in the case of using the invention.
Figure 7B:
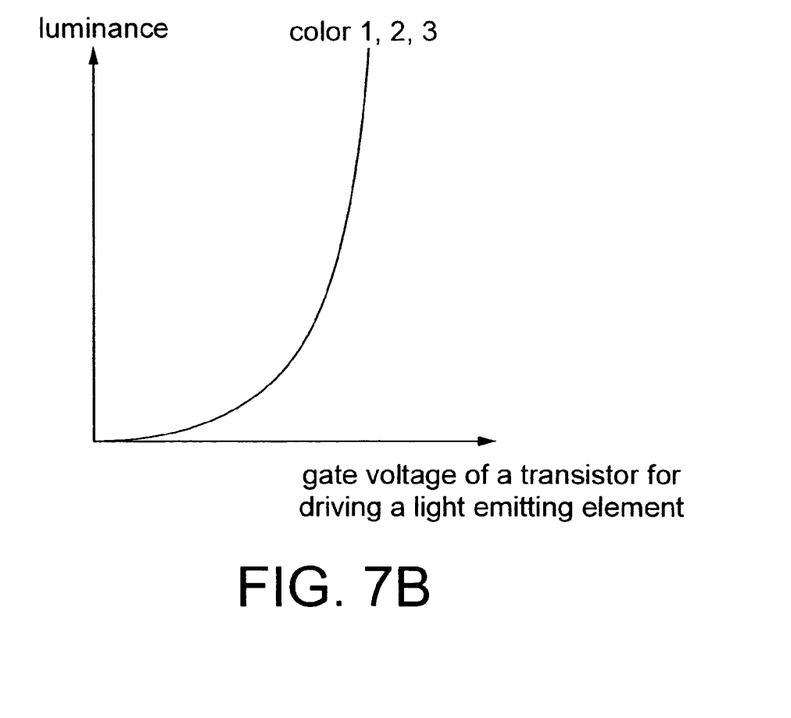

In the case of driving in an analog manner, conventionally, a gate voltage (video signal) of a transistor for driving a light emitting element is changed for each color of RGB as shown in FIG. 7A. According to the invention, as shown in FIG. 7B, the gate voltage is not required to be changed for each color of RGB. Thus, an external circuit can be made smaller and the cost can be reduced.

Embodiment Mode 4

Figure 8A:
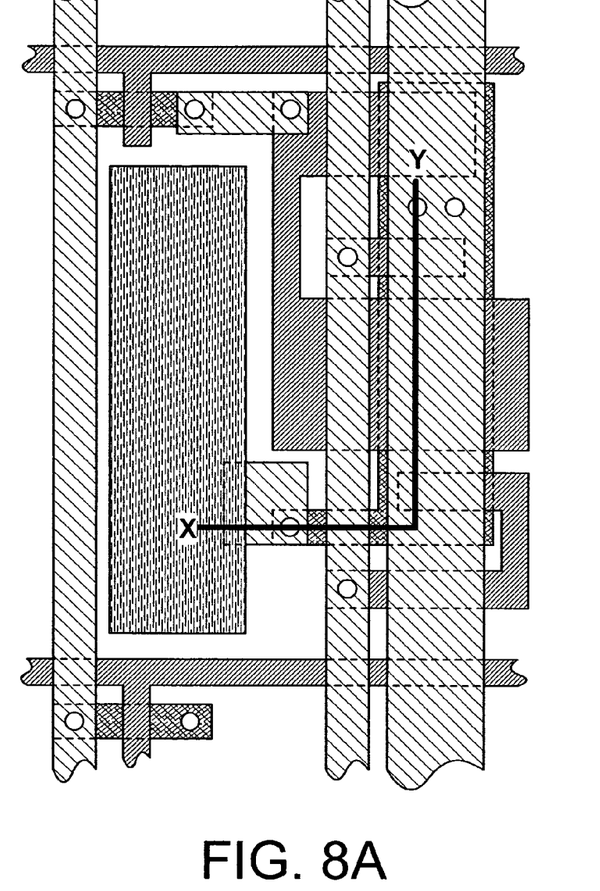
FIGS. 8A and 8B are layout diagrams of a pixel using the invention.
Figure 8B:
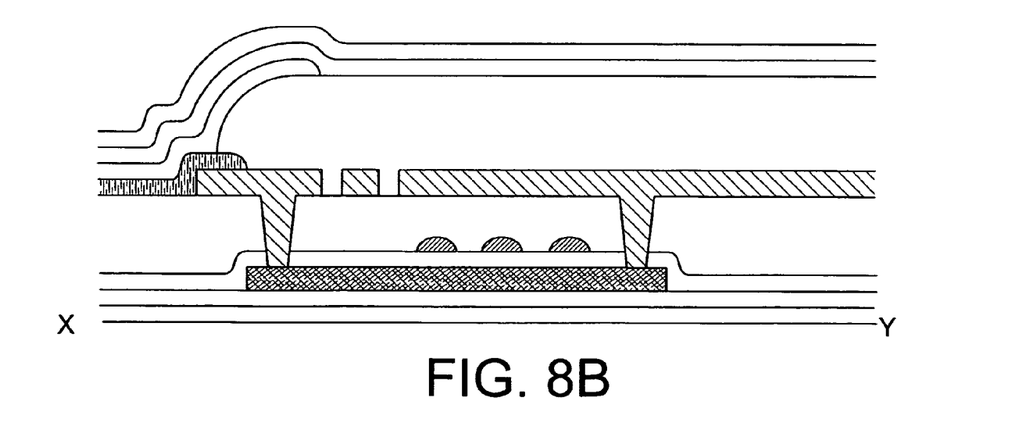

With reference to FIG. 8A, shown in this embodiment mode is a layout example of a sub-pixel in the case where the circuit diagram of FIG. 6A described in Embodiment Mode 3 is implemented by using a low temperature polysilicon thin film transistor. Further, FIG. 8B shows a cross sectional view of a driving transistor shown in the layout example. Note that the layout of a sub-pixel is not limited to the one shown here.

Embodiment Mode 5

Figure 9:
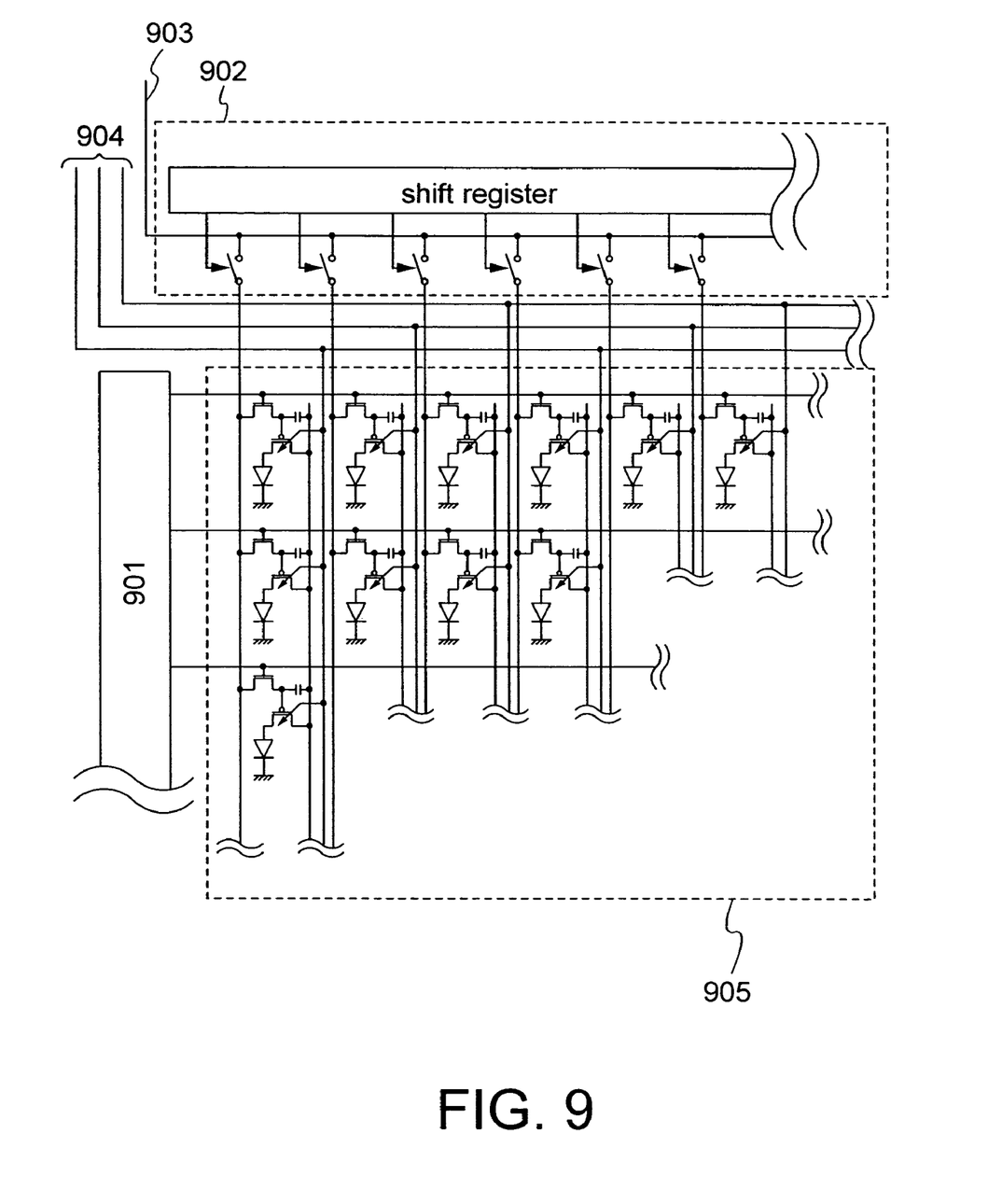
FIG. 9 is a circuit diagram of a display device according to the invention.

A circuit structure of a display device using the invention is described with reference to FIG. 9. The display device shown in FIG. 9 comprises a scan line driver circuit 901, a signal line driver circuit 902 including a shift register, a sampling circuit, and the like, a video line 903, control gate signal lines 904, and a pixel portion 905 including a plurality of sub-pixels arranged in matrix. As shown in the drawing, the sub-pixels are connected to the control gate signal lines 904 which are different for each color.

Figure 10:
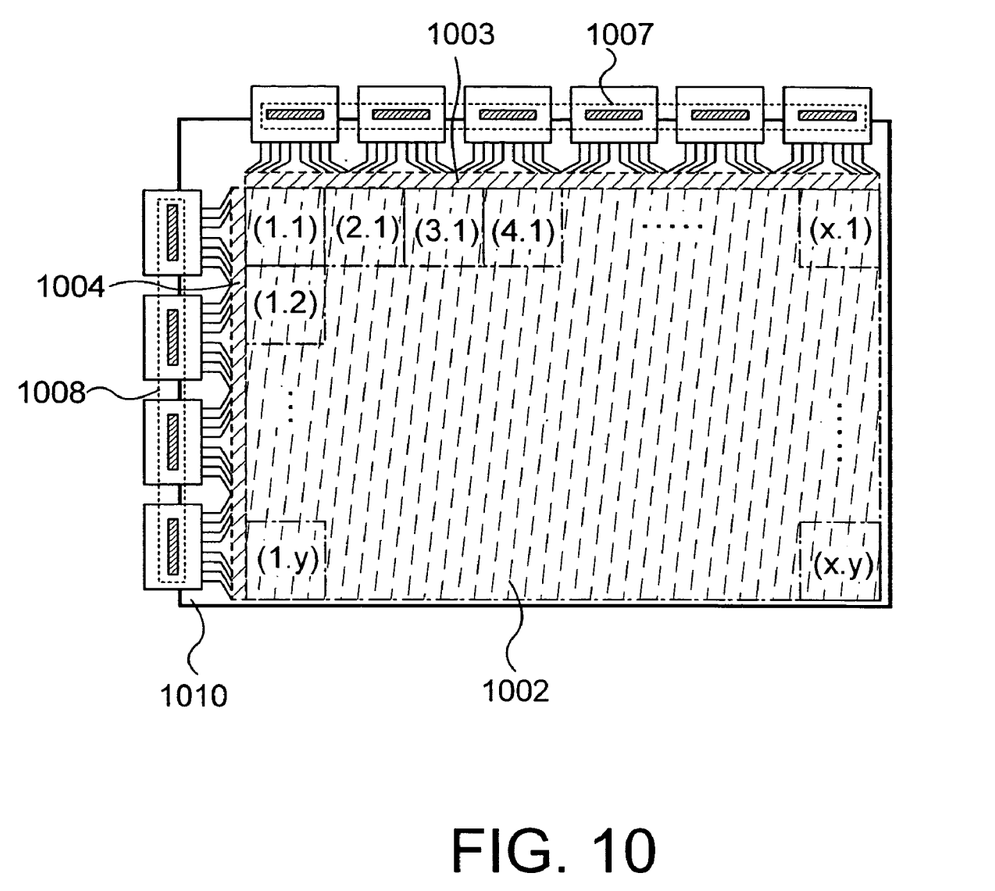
FIG. 10 is a diagram of a display device according to the invention.

A structure of a display device using the invention is described with reference to FIG. 10. FIG. 10 is a top plan view schematically showing a semiconductor device. A pixel portion (display portion) 1002, protective circuits 1003 and 1004 are formed over a substrate 1010, and connected through lead wirings to a driver IC 1007 on a signal line side and a driver IC 1008 on a scan line side. In the case of an amorphous semiconductor or a microcrystalline semiconductor being used as an element constituting the pixel portion 1002, as shown in the drawing, the driver ICs 1007 and 1008 may be mounted by a known method such as COG or TAB to be used as driver circuits. Note that in the case of a microcrystalline semiconductor being used as an element constituting the pixel portion 1002, a driver circuit on the scan line side may be constituted by the microcrystalline semiconductor and the driver IC 1007 may be mounted on the signal line side.

As another structure, a part of the driver circuits on the scan line side and the signal line side may be integrally formed onto the same substrate, or a driver IC may be used for a part of them. In other words, a driver IC can be mounted in various structures, and the invention can be applied to any structure.

Embodiment Mode 6

The invention can be applied to various electronic appliances such as a digital camera, an audio reproducing device such as an in-car audio system, a laptop personal computer, a game machine, a portable information terminal (mobile phone, portable game machine, and the like), and an image reproducing device provided with a recording medium such as a home game machine. Specific examples of such electronic appliances are shown in FIGS. 11A to 11C and FIGS. 12A to 12C.

Figure 11A:
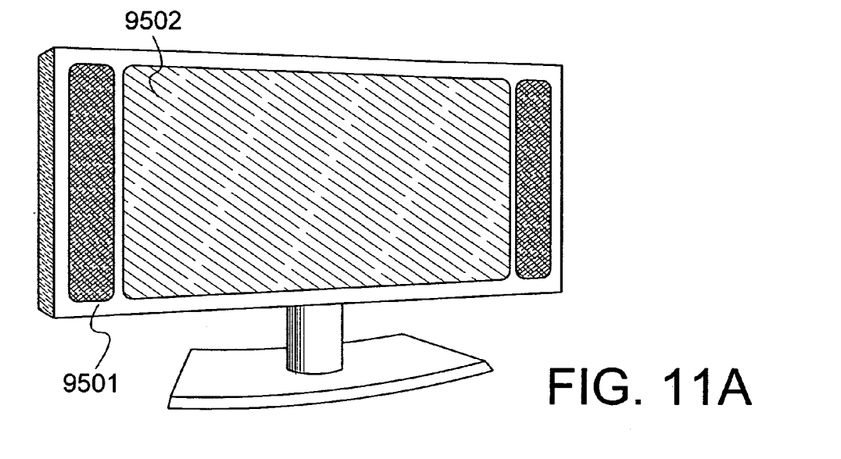
FIGS. 11A to 11C are views of electronic appliances to which the invention can be applied.
Figure 11B:
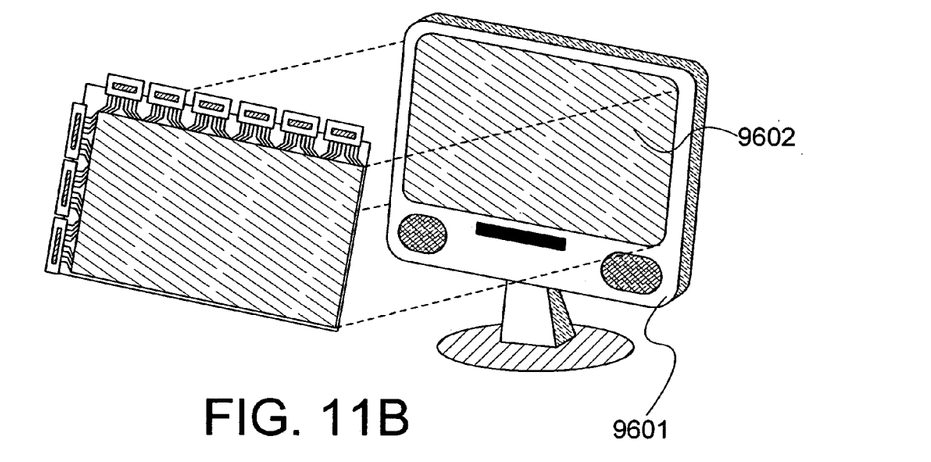
Figure 11C:
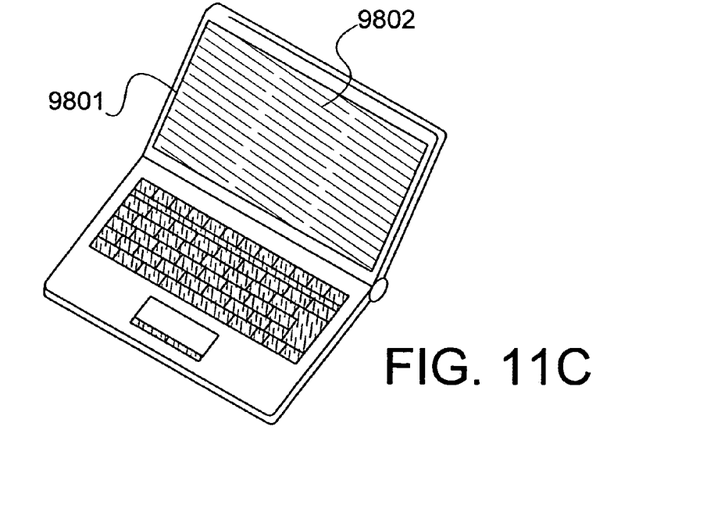

FIG. 11A illustrates a TV set which includes a housing 9501, a display portion 9502, and the like. FIG. 11B illustrates a monitor for a personal computer, which includes a housing 9601, a display portion 9602, and the like. FIG. 11C illustrates a laptop personal computer which includes a housing 9801, a display portion 9802, and the like. The invention can be applied to the display portions of the aforementioned electronic appliances. Since the display portions of the aforementioned electronic appliances are large as compared with those of portable information terminals, a large glass substrate of so-called fourth generation or fifth generation or later is necessarily used. Therefore, reduction in cost can be achieved according to the invention using a droplet ejection method for forming wirings, in which the usability of a material is improved and the number of steps can be suppressed as compared with the case of using a photolithography step. In addition, in view of the manufacturing steps and cost, it is preferable to use a transistor whose channel portion is formed of an amorphous semiconductor or a microcrystalline semiconductor.

Figure 12A:
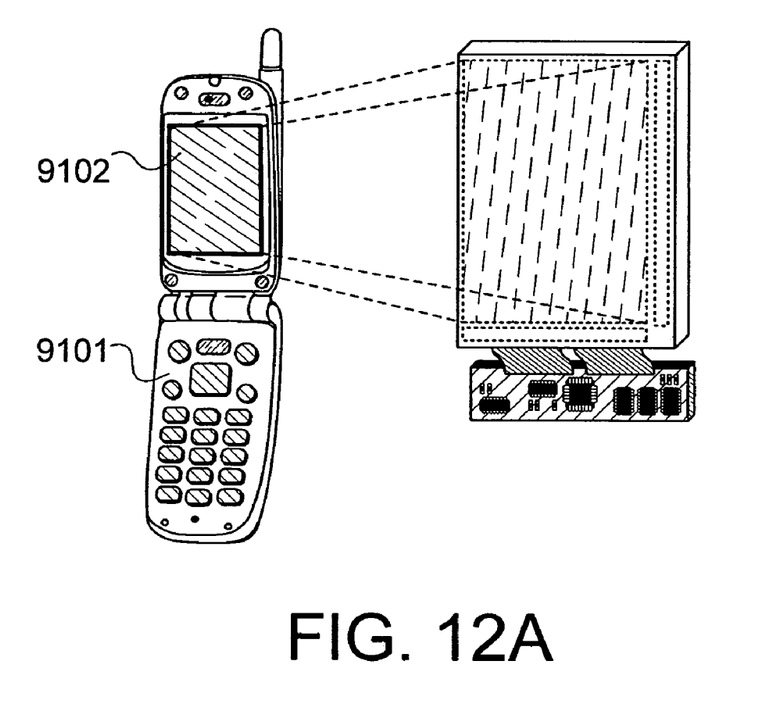
FIG. 12A to 12C are views of electronic appliances to which the invention can be applied.
Figure 12B:
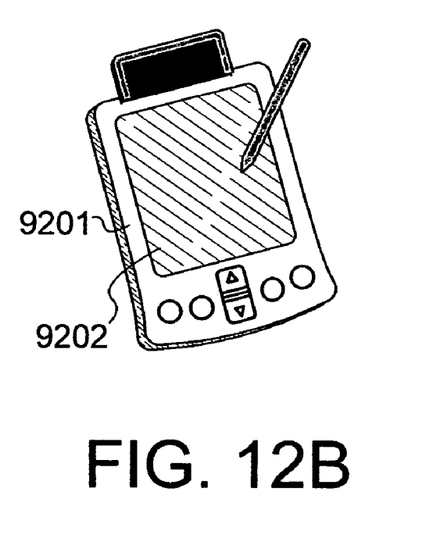
Figure 12C:
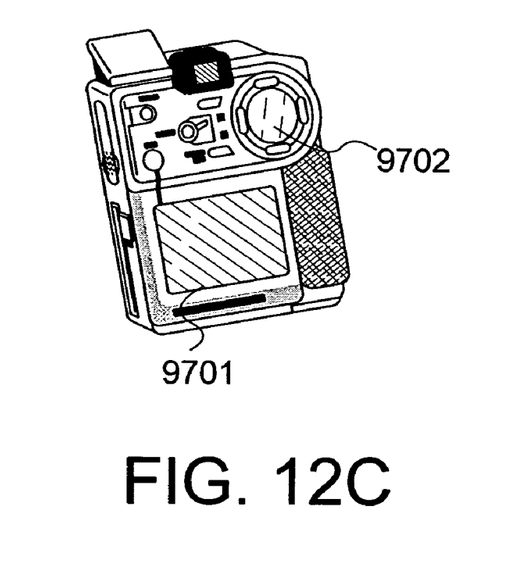

FIG. 12A illustrates a mobile information phone as a portable terminal, which includes a housing 9101, a display portion 9102, and the like. FIG. 12B illustrates a PDA as a portable information terminal, which includes a housing 9201, a display portion 9202, and the like. FIG. 12C illustrates a video camera which includes a display portion 9701, a display portion 9702, and the like. The invention can be applied to the display portions of the aforementioned electronic appliances. Since the aforementioned electronic appliances are portable information terminals, the display portions thereof are relatively small. Therefore, a driver circuit using a thin film transistor whose channel portion is formed of a polycrystalline semiconductor, a functional circuit such as a CPU, and a multiple wiring are preferably mounted on the same substrate as the display portion in order to reduce the size. At this time, reduction in cost can be achieved according to the invention using a droplet ejection method for forming wirings, in which the number of steps can be suppressed. Further, the aforementioned electronic appliances as portable information terminals may include a light emitting element in the display portion in view of a higher added value such as thinness, lightweight, and downsizing. This embodiment mode can be implemented in combination with the embodiment modes described above.

This application is based on Japanese Patent Application serial No. 2003-368075 filed in Japan Patent Office on 28th, Oct., 2003, the contents of which are hereby incorporated by reference.

What is claimed is:

1. A display device comprising:
   a transistor for driving a light emitting element, the transistor comprising:
   a main gate and a control gate over a substrate;
   an insulating layer formed over the main gate and the control gate;
   a first semiconductor layer formed over the insulating layer;
   a second semiconductor layer formed over the first semiconductor layer; and
   a source electrode and a drain electrode formed over the second semiconductor layer,
   wherein the control gate is provided between the main gate and at least one of the source electrode and the drain electrode of the transistor.

2. An electronic appliance having the display device according to claim 1.

3. An electronic appliance according to claim 2, wherein the electronic appliance is selected from the group consisting of a digital camera, an audio reproducing device, a laptop personal computer, a game machine, a portable information terminal, an image reproducing device provided with a recording medium, a TV set, a monitor for a personal computer, and a video camera.

4. The display device according to claim 1, wherein the main gate and the control gate are surrounded by the substrate and the insulating layer.

5. The display device according to claim 1, wherein the transistor is provided in a pixel portion.

6. A display device comprising:
   a transistor for driving a display element, the transistor comprising:
   a main gate and a control gate over a substrate;
   an insulating layer formed over the main gate and the control gate;
   a first semiconductor layer formed over the insulating layer;
   a second semiconductor layer formed over the first semiconductor layer; and
   a source electrode and a drain electrode formed over the second semiconductor layer,
   wherein the control gate is provided between the main gate and at least one of the source electrode and the drain electrode of the transistor.

7. An electronic appliance having the display device according to claim 6.

8. An electronic appliance according to claim 7, wherein the electronic appliance is selected from the group consisting of a digital camera, an audio reproducing device, a laptop personal computer, a game machine, a portable information terminal, an image reproducing device provided with a recording medium, a TV set, a monitor for a personal computer, and a video camera.

9. The display device according to claim 6, wherein the main gate and the control gate are surrounded by the substrate and the insulating layer.

10. The display device according to claim 6, wherein the transistor is provided in a pixel portion.

11. A display device comprising:
    a transistor for driving a light emitting element, the transistor comprising:
    a main gate and a control gate over a substrate;
    a first insulating layer formed over the main gate and the control gate;
    a first semiconductor layer formed over the insulating layer;
    a second semiconductor layer formed over the first semiconductor layer; and
    a source electrode and a drain electrode formed over the second semiconductor layer,
    a second insulating layer having an opening portion formed over the transistor;
    a first conductive layer formed over the second insulating layer and connected to one of the source electrode and the drain electrode through the opening portion;
    a bank formed over the second insulating layer and the first conductive layer;
    a light emitting layer formed over the first conductive layer; and
    a second conductive layer formed over the bank and the light emitting layer.

12. An electronic appliance having the display device according to claim 11.

13. An electronic appliance according to claim 11, wherein the electronic appliance is selected from the group consisting of a digital camera, an audio reproducing device, a laptop personal computer, a game machine, a portable information terminal, an image reproducing device provided with a recording medium, a TV set, a monitor for a personal computer, and a video camera.

14. The display device according to claim 11, wherein the main gate and the control gate are surrounded by the substrate and the first insulating layer.

15. The display device according to claim 11, wherein the first conductive layer is formed by a light transmitting material.

16. The display device according to claim 11, wherein the main gate and the control gate are overlapped with the bank.

17. The display device according to claim 11, wherein the transistor is provided in a pixel portion.

* * * * *